US010504717B2

(12) United States Patent
Yan et al.

(10) Patent No.: US 10,504,717 B2
(45) Date of Patent: Dec. 10, 2019

(54) INTEGRATED SYSTEM AND METHOD FOR SOURCE/DRAIN ENGINEERING

(71) Applicant: Applied Materials, Inc., Santa Clara, CA (US)

(72) Inventors: Chun Yan, San Jose, CA (US); Xinyu Bao, Fremont, CA (US); Melitta Manyin Hon, San Jose, CA (US); Hua Chung, San Jose, CA (US); Schubert S. Chu, San Francisco, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/417,496

(22) Filed: Jan. 27, 2017

(65) Prior Publication Data
US 2018/0082836 A1    Mar. 22, 2018

Related U.S. Application Data

(60) Provisional application No. 62/423,082, filed on Nov. 16, 2016, provisional application No. 62/395,765, filed on Sep. 16, 2016.

(51) Int. Cl.
*H01L 21/48* (2006.01)
*H01L 21/02* (2006.01)
*H01L 29/66* (2006.01)

(52) U.S. Cl.
CPC .. *H01L 21/02057* (2013.01); *H01L 29/66636* (2013.01); *H01L 29/66795* (2013.01)

(58) Field of Classification Search
CPC ......... H01L 21/02057; H01L 21/76814; H01L 21/3065; H01L 21/31116; H01L 29/66636; H01L 29/66795
See application file for complete search history.

(56) References Cited

U.S. PATENT DOCUMENTS 6,924,517 B2   8/2005  Chen et al.
7,755,171 B2   7/2010  Zhu
(Continued)

FOREIGN PATENT DOCUMENTS

KR   20070108212 A   11/2007

OTHER PUBLICATIONS

International Search Report and Written Opinion for Application No. PCT/US2017/015300 dated Apr. 28, 2017.

*Primary Examiner* — Robert G Bachner
(74) *Attorney, Agent, or Firm* — Patterson + Sheridan LLP

(57) ABSTRACT

Implementations described herein generally provide a method of processing a substrate. Specifically, the methods described are used for cleaning and etching source/drain regions on a silicon substrate in preparation for precise Group IV source/drain growth in semiconductor devices. Benefits of this disclosure include precise fin size control in devices, such as 10 nm FinFET devices, and increased overall device yield. The method of integrated clean and recess includes establishing a low pressure processing environment in the processing volume, and maintaining the low pressure processing environment while flowing a first gas over a substrate in a processing volume, depositing a salt on the substrate, heating the processing volume to greater than 90° C., purging the processing volume with a second inert gas, and recessing a source/drain region disposed on the substrate.

16 Claims, 2 Drawing Sheets

(56) References Cited

U.S. PATENT DOCUMENTS

| | | | |
|---|---|---|---|
| 9,324,713 B1 | 4/2016 | Yu et al. | |
| 9,653,318 B2 | 5/2017 | Or et al. | |
| 2004/0142557 A1* | 7/2004 | Levy | C23C 16/0272 |
| | | | 438/680 |
| 2006/0024898 A1 | 2/2006 | Chidambaram et al. | |
| 2006/0246217 A1* | 11/2006 | Weidman | B82Y 30/00 |
| | | | 427/99.5 |
| 2011/0151674 A1 | 6/2011 | Tang et al. | |
| 2011/0278673 A1 | 11/2011 | Fuller et al. | |
| 2014/0191318 A1 | 7/2014 | Lin et al. | |
| 2014/0193979 A1 | 7/2014 | Or et al. | |
| 2014/0357040 A1 | 12/2014 | Loubet et al. | |
| 2014/0363979 A1 | 12/2014 | Or et al. | |
| 2015/0072508 A1* | 3/2015 | Or | H01L 21/326 |
| | | | 438/466 |
| 2015/0111389 A1* | 4/2015 | He | H01L 21/02057 |
| | | | 438/723 |
| 2015/0270122 A1 | 9/2015 | Tolle | |
| 2016/0020301 A1 | 1/2016 | Park et al. | |
| 2016/0064212 A1 | 3/2016 | Thedjoisworo et al. | |
| 2016/0141175 A1* | 5/2016 | Yan | H01L 21/02046 |
| | | | 438/509 |
| 2016/0190133 A1 | 6/2016 | Wu et al. | |
| 2016/0190319 A1 | 6/2016 | Kavalieros et al. | |
| 2017/0117118 A1 | 4/2017 | Toh | |
| 2017/0117235 A1* | 4/2017 | Borenstein | H01L 23/573 |
| 2017/0373166 A1 | 12/2017 | Bergendahl et al. | |

\* cited by examiner

US 10,504,717 B2

INTEGRATED SYSTEM AND METHOD FOR SOURCE/DRAIN ENGINEERING

BACKGROUND

Field

Implementations of the present disclosure generally relate to the manufacture of semiconductor devices. More specifically, implementations described herein relate to methods for source/drain engineering.

Description of the Related Art

Integrated circuits are formed in and on silicon and other semiconductor substrates. In the case of single crystal silicon, substrates are made by growing an ingot from a bath of molten silicon, and then sawing the solidified ingot into multiple substrates. An epitaxial silicon layer may then be formed on the monocrystalline silicon substrate to form a defect-free silicon layer that may be doped or undoped. Semiconductor devices, such as transistors, are manufactured from the epitaxial silicon layer. The electrical properties of the formed epitaxial silicon layer will generally be better than the properties of the monocrystalline silicon substrate.

Group IV elements may be advantageous in certain applications for forming silicon-based devices. For example, Group IV elements may serve as a source/drain region in sub-10 nm Fin Field Effect Transistor (FinFET) devices due to the low contact resistance, superior electron mobility and lower operation voltage. However, there are major challenges in preparing a substrate for Group IV source/drain growth. Surfaces of the monocrystalline silicon and the epitaxial silicon layer are susceptible to contamination when exposed to typical fabrication facility ambient conditions, and there might be a few atomic layers of damaged Si from previous process steps. For example, a native oxide layer may form on the monocrystalline silicon surface prior to deposition of the epitaxial layer. Additionally, contaminants present in the ambient environment may deposit on the monocrystalline surface and may come from previous process steps. The presence of a native oxide layer or contaminants on the monocrystalline silicon surface negatively affects the quality of an epitaxial layer subsequently formed on the monocrystalline surface. While present cleaning methods remove some of the native oxides and contaminants from the monocrystalline silicon surface, some contaminants may still remain.

Therefore, there is a need for a method for integrated cleaning a substrate surface and subsequent recessing prior to performing an epitaxial deposition process.

SUMMARY

Implementations described herein generally provide a method of processing a workpiece. The method of processing the workpiece includes disposing the workpiece in a processing volume. The workpiece includes a substrate. The substrate includes a source/drain region disposed on the substrate. The method of disposing a workpiece also includes establishing a low pressure processing environment in the processing volume. The method of disposing a workpiece also includes maintaining the low pressure processing environment while delivering a first gas containing to the processing volume, depositing a salt on the workpiece, heating the substrate to greater than 90° C., purging the processing volume with an inert gas, and recessing the source/drain regions.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope, for the disclosure may admit to other equally effective implementations.

Figure 1:
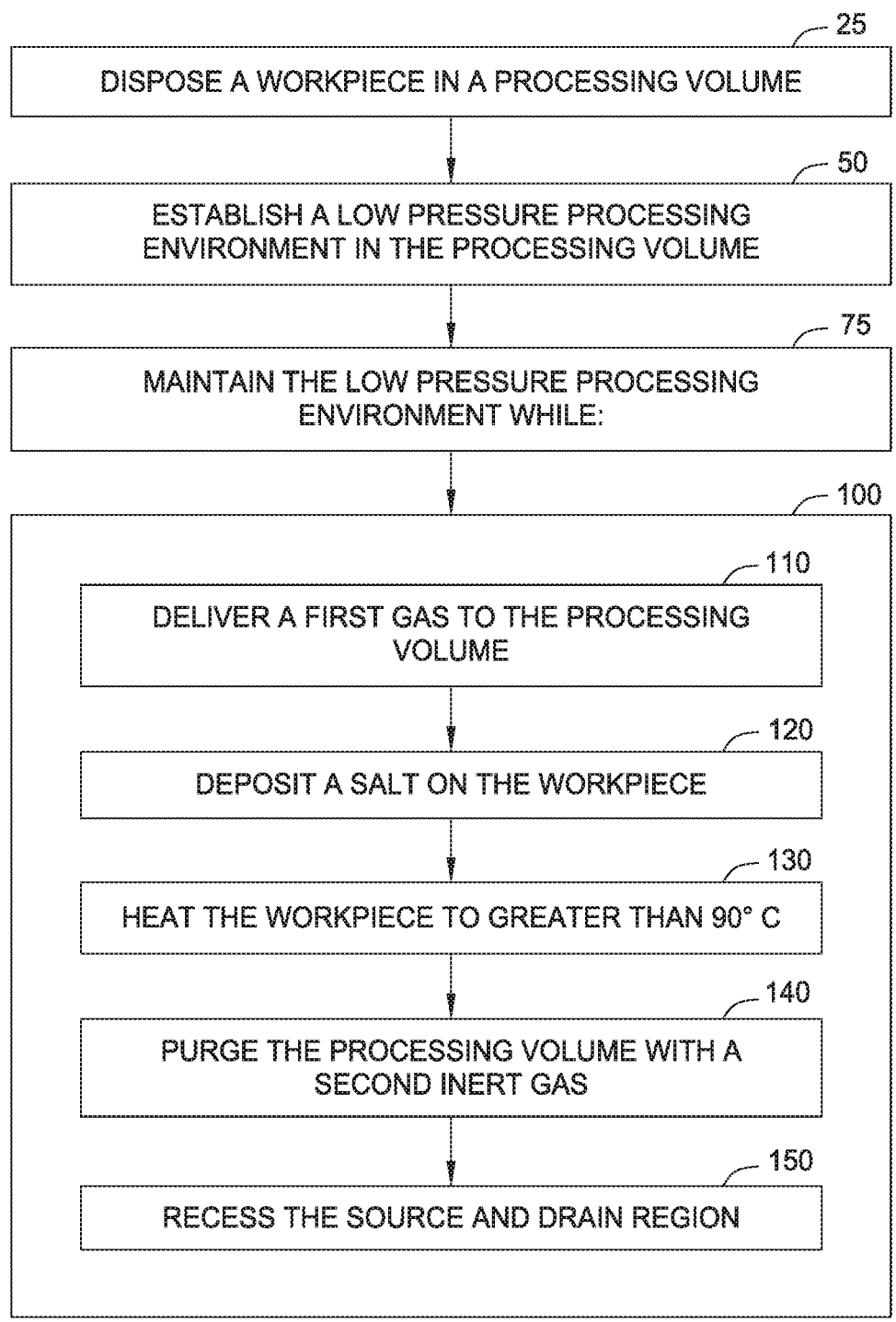
FIG. 1 is a flow diagram illustrating operations of a method according to one implementation described herein.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Implementations of the present disclosure generally relate to methods for forming semiconductor devices. More specifically, methods are described for sub-10 nm cleaning and recessing substrates in preparation for precise Group IV source/drain growth in FinFET devices.

Figure 2A:
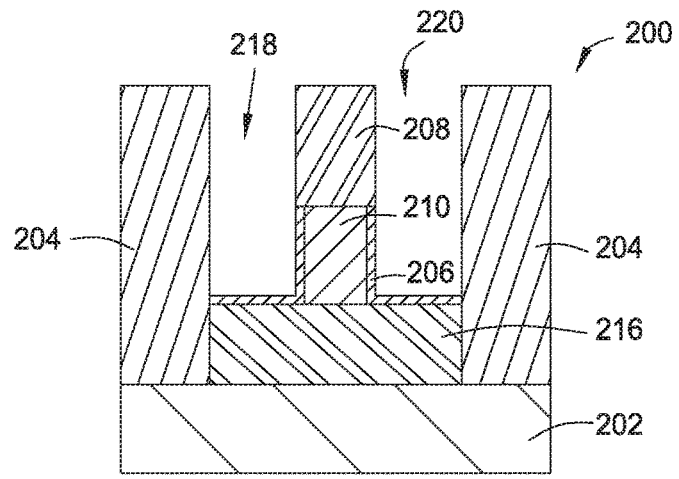
FIGS. 2A-2C illustrate a schematic, cross-sectional view of a device structure depicting stages of fabrication in accordance with the method of FIG. 1.
Figure 2B:
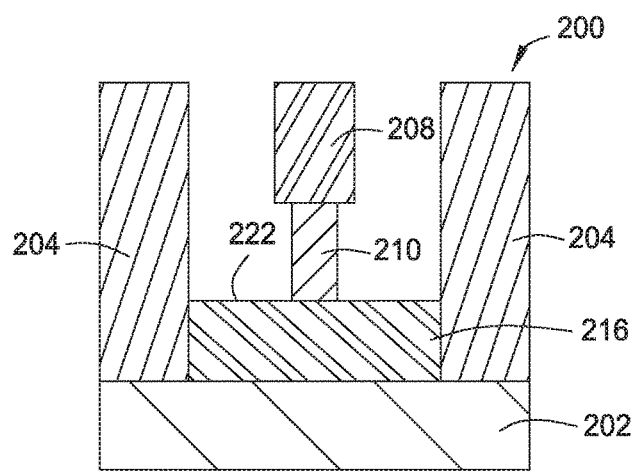
Figure 2C:
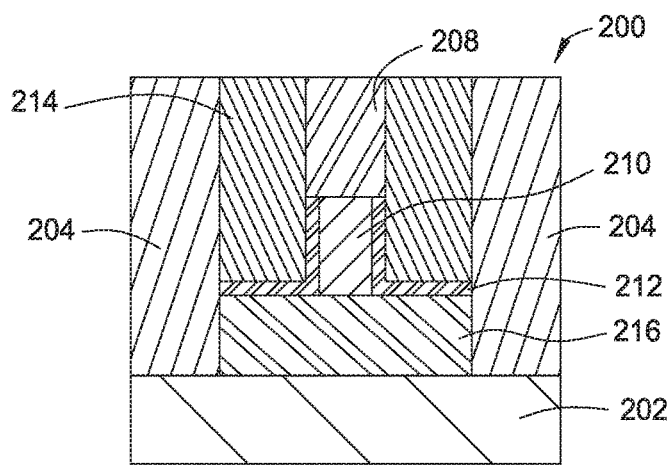

FIG. 1 is a flow diagram illustrating a method 100 for cleaning and recessing substrates in preparation for precise source/drain deposition comprising Group IV elements on a silicon substrate. FIGS. 2A-2C depict stages of fabrication of a device structure in accordance with the method 100 of FIG. 1. The method 100 is described below in accordance with operations of cleaning and recessing a substrate as illustrated in FIGS. 2A-2C.

As illustrated in FIG. 1, a workpiece, including a substrate 202 with a device 200 that has a source/drain region formed on the substrate, is disposed in a processing volume at step 25. For example, the device may have sub-10 nm trenches 218, 220. The processing volume may be contained within a processing chamber. The workpiece is shown in FIG. 2, and may be pre-cleaned prior to performing the method 100. The pre-cleaning may include any conventional wet or dry cleaning method.

As shown in FIG. 2A, the workpiece has a device 200 that includes a dielectric material 204 disposed on a substrate 202, a pre source/drain region 216, a fin layer 210 disposed on the pre source/drain region 216, a dummy gate 208, and contaminants 206. In one implementation, the pre source/drain region 216 may be disposed on the substrate 202 and within the dielectric material 204. The dummy gate 208 may be disposed on the fin layer 210. The contaminants 206 may be disposed on the pre source/drain region 216 and the fin layer 210. The substrate 202 may be a silicon-containing substrate. The substrate 202 may further comprise germanium (Ge), carbon (C), boron (B), phosphorous (P), or other materials that may be co-grown, doped and/or associated with silicon materials. The substrate 202 may be part of a device, such as a fin shaped field effect transistor (FinFET) device. In one implementation, the FinFET device may be sized for the 10 nm node.

The dielectric material 204, such as a shallow trench isolation (STI) oxide, may comprise one or more of silicon oxide (SiO), silicon dioxide ($SiO_2$), silicon nitride (SiN), silicon oxynitride (SiON), or other suitable materials that may be used to form a dielectric material. The dielectric material 204 may be deposited by various deposition processes. For example, the dielectric material 204 may be deposited by a chemical vapor deposition (CVD) process, which may be plasma enhanced. The contaminants 206 may include native oxide and dangling silicon bonds saturated with hydrogen such as $SiO_2$ or $GeO_2$. The dummy gate 208 may comprise silicon nitride (SiN). The pre source/drain region 216 may comprise silicon and may further comprise germanium (Ge), carbon (C), boron (B), phosphorous (P), or other materials that may be co-grown, doped and/or associated with silicon materials.

The workpiece, including the device 200, may be placed in an inductively coupled plasma (ICP) plasma reactor chamber. Suitable chambers include the CENTRIS® or MESA® chamber available from Applied Materials, Inc. of Santa Clara, Calif. Chambers available from other manufacturers may also be used to practice implementations described herein. A low pressure processing environment may be established within the chamber at step 50 of FIG. 1. The low pressure processing environment may be maintained (at step 75 of FIG. 1) while each of the operations of method 100 proceed. At operation 110 of FIG. 1, a first gas may be delivered over the workpiece, including substrate 202 in the processing volume. The first gas may be a hydrogen argon ($H_2Ar$) gas mixture. The first gas may be inert. In one implementation, the ion energy is controlled with low RF source power between 200-800 watts or plasma pulsing. The hydrogen gas may be flowed at a rate of between 10-500 sccm, and the argon may be flowed at a rate of between 300-1000 sccm. While the first gas is delivered, the pressure of the processing volume may be maintained between 5 mT to 50 mT. The temperature of the processing volume may be between 20° C. and 40° C., and the ion energy may be less than 50 electronvolt (eV). The first gas mixture producing the low energy ions may advantageously penetrate the native oxide contaminants 206 located within trenches 218, 220 to break silicon-oxygen bonds in preparation for subsequent removal and activate the sub-oxide (SiO) disposed underneath. In one implementation, the hydrogen ions or radicals within the first gas mixture react with the native oxide to form volatile hydroxides. The dry clean gas mixture may be able to penetrate the small sub-10 nm trenches and contaminants efficiently to provide for a higher throughput without damaging the device 200.

At operation 120 of FIG. 1, while a higher pressure environment is maintained, a salt is deposited on the pre source/drain region 216. In one implementation, a $NH_3/NF_3/Ar$ gas mixture is delivered to the processing volume to react with the generated plasma and form a $NH_4F$ salt. The $NH_4F$ salt is deposited on the pre source/drain region 216. At operation 130, the workpiece is heated to greater than 90° C. In one implementation, the workpiece is heated to greater than 90° C. for greater than 1 minute. Heating the workpiece may remove the contaminants 206 to expose a clean silicon surface 222, as shown in FIG. 2B. In one implementation, the $NH_4F$ salt may react with and remove the native oxide contaminants 206 from the pre source/drain region 216 and fin layer 210. The $NH_4F$ salt may expose the underlying silicon surface 222 in the pre source/drain region 216 without damaging the underlying silicon surface. In one implementation, the $NH_3/NF_3/Ar$ gas mixture is delivered to the processing volume which is maintained at a pressure of 200-900 mT. The continuous mode RF power may be maintained between 200-400 watts. The argon is flowed at a rate of 500-1200 sccm, the ammonia ($NH_3$) is flowed at a rate of 10-100 sccm, and the $NF_3$ is flowed at a rate of 5-20 sccm.

At operation 140, while the low pressure environment is maintained, the processing volume and gas lines are purged using an inert gas mixture. The inert gas mixture may be a $H_2/Ar$ plasma mixture. The inert gas mixture advantageously removes any residual ammonia ($NH_3$) inside the chamber and gas line providing for a clean surface in preparation for subsequent processing operations.

As shown in FIG. 1, at operation 150, while the low pressure environment is maintained, the pre source/drain region 216 is recessed by etching. In one implementation, the fin layer 210 may also be recessed. In one implementation, the width of the fin layer 210 is reduced about between 1-2 nm. Suitable methods of etching the pre source/drain region 216 or the fin layer 210 or a combination of both include any suitable etching process, such as anisotropic dry etching. In one implementation, argon (Ar), hydrogen (H), and/or chlorine (Cl) may be used as precursors to produce an etchant plasma for etching the fin layer 210. In another implementation, a $H_2/Cl_2/Ar$ plasma is used for etching the pre source/drain region 216. The plasma mixture may function to volatilize the pre source/drain region 216 such that a portion may be removed. In one implementation, the pre source/drain region 216 is etched 1-2 nm or at a rate between 0.5 nm/min-3 nm/min. In one implementation, the plasma ion energy is less than 20 eV with plasma pulsing, the pressure of the processing volume may be maintained between 5-50 mTorr, the temperature is between 30° C.–50° C., and the RF power is between 500-600 watts. This step may use very low ion energy which is controlled by RF source pulsing without bias power. The argon may be flowed at a rate between 100-500 sccm, the hydrogen may be flowed at a rate between 50-300 sccm, and the chlorine may be flowed at a rate between 10-100 sccm. In one implementation, the ratio of Cl:H:Ar may be between 1:5:10 to 1:3:5. The low energy $H_2/Cl_2/Ar$ plasma pulsing provides for precise control in the nm scale while reducing silicon-silicon lattice damage. The integrated clean and recess process provides for a source/drain region free of carbon and oxide contaminants while reducing the silicon-silicon lattice damage in preparation for subsequent processing.

As shown in FIG. 2C, a source/drain extension 212 may be deposited over the cleaned and recessed pre source/drain region 216. In one implementation, the source/drain extension 212 is silicon arsenide (SiAs). A source/drain layer 214 may be deposited on the source/drain extension 212. In one implementation, the source/drain layer 214 is silicon phosphide (SiP).

The integrated clean and recess process prepares the device 200 for subsequent processing while maintaining a low pressure environment. More specifically, the resulting source/drain region may be free of contaminants and/or defects, may has a desired shape, and may be prepared for subsequent epitaxial growth. The device 200 may undergo additional processing steps within the same cluster tool. Use of a single apparatus containing various processing chambers allows for the various operations of the method 100 of FIG. 1 to occur while maintaining a low pressure environment. More specifically, the low pressure environment need not be broken during transfer to an epitaxial chamber for source/drain extension 212 and source/drain layer 214 growth. In one implementation, additional processing may include replacing the dummy gate 208 with a metal gate.

Thus, methods described for cleaning and etching source/drain regions on a silicon substrate in preparation for precise Group IV source/drain growth in semiconductor devices are provided. Benefits of this disclosure include precise fin size control in devices, such as sub-10 nm FinFET devices, and increased overall device yield.

While the foregoing is directed to implementations of the present disclosure, other and further implementations of the disclosure may be devised without departing from the basic scope thereof, and the scope thereof is determined by the claims that follow.

What is claimed is:

1. A method of processing a workpiece, comprising:
    delivering a first gas to a processing volume while maintaining a first pressure in the processing volume;
    depositing a $NH_4F$ salt on a workpiece in the processing volume while maintaining a second pressure in the processing volume;
    heating the workpiece to greater than 90° C. while maintaining the second pressure in the processing volume;
    purging the processing volume with a second gas while maintaining the first pressure in the processing volume; and
    recessing a source/drain region of a device disposed on the workpiece while maintaining the first pressure in the processing volume, wherein
    the second pressure in higher than the first pressure.

2. The method of claim 1, wherein the device has sub-10 nm trenches.

3. The method of claim 1, wherein a fin layer is disposed on the source/drain region, further comprising recessing the fin layer.

4. The method of claim 1, wherein the processing volume is defined by an inductively coupled plasma (ICP) plasma reactor chamber.

5. The method of claim 1, wherein the first gas is a hydrogen argon gas mixture.

6. The method of claim 5, wherein the hydrogen is flowed at a rate of between 10-500 sccm, and the argon is flowed at a rate of between 300-1000 sccm.

7. The method of claim 1, further comprising controlling ion energy near the workpiece with low RF source power between 200-800 watts.

8. The method of claim 1, wherein the first pressure is between 5 mT to 50 mT in the processing volume.

9. The method of claim 1, further comprising maintaining a temperature of the processing volume at between 20° C. and 40° C.

10. The method of claim 1, further comprising maintaining an ion energy of the processing volume at less than 50 electronvolt.

11. The method of claim 1, wherein depositing the $NH_4F$ salt on the workpiece comprises:
    delivering a $NH_3/NF_3/Ar$ gas mixture to the processing volume; and
    reacting the gas mixture with a plasma in the processing volume.

12. The method of claim 11, wherein the argon (Ar) is flowed at a rate of 500-1200 sccm, the ammonia ($NH_3$) is flowed at a rate of 10-100 sccm, and the $NF_3$ is flowed at a rate of 5-20 sccm.

13. The method of claim 1, wherein heating the workpiece to greater than 90° C. occurs for greater than 1 minute.

14. The method of claim 1, wherein the second gas is a $H_2/Ar$ plasma mixture.

15. The method of claim 1, wherein recessing a source/drain region includes etching the source/drain region 1-2 nm.

16. The method of claim 1, wherein the second pressure in between 200 mT to 900 mT in the processing volume.

* * * * *